US006812483B2

(12) United States Patent
Ohno et al.

(10) Patent No.: US 6,812,483 B2
(45) Date of Patent: Nov. 2, 2004

(54) OPTICAL SEMICONDUCTOR ELEMENT UTILIZING OPTICAL TRANSITION BETWEEN ZNO HETEROSTRUCTURE SUB-BANDS

(75) Inventors: Hideo Ohno, Sendai (JP); Masashi Kawasaki, Sendai (JP); Keita Ohtani, Sendai (JP)

(73) Assignee: Japan Science and Technology Agency, Kawaguchi (JP)

( * ) Notice: Subject to any disclaimer, the term of this patent is extended or adjusted under 35 U.S.C. 154(b) by 0 days.

(21) Appl. No.: 10/451,378

(22) PCT Filed: Jan. 4, 2002

(86) PCT No.: PCT/JP02/00006
§ 371 (c)(1),
(2), (4) Date: May 12, 2004

(87) PCT Pub. No.: WO02/056392

PCT Pub. Date: Jul. 18, 2002

(65) Prior Publication Data

US 2004/0173883 A1 Sep. 9, 2004

(30) Foreign Application Priority Data

Jan. 5, 2001 (JP) ........................................ 2001-000841

(51) Int. Cl.[7] ..................... H01L 29/06; H01L 31/0328; H01L 31/0336; H01L 31/072; H01L 31/109
(52) U.S. Cl. ............................. 257/22; 257/21; 257/23; 257/13
(58) Field of Search .............................. 257/14, 15, 13, 257/21, 22, 23, 17

(56) References Cited

U.S. PATENT DOCUMENTS

| 4,959,696 | A | * | 9/1990 | Frensley et al. | ............... 257/15 |
| 5,457,709 | A | | 10/1995 | Capasso et al. | |
| 6,586,779 | B2 | * | 7/2003 | Tsuda et al. | ................. 257/103 |
| 6,593,589 | B1 | * | 7/2003 | Osinski et al. | ................. 257/22 |

FOREIGN PATENT DOCUMENTS

| EP | 0 996 204 A2 | 4/2000 |
| JP | 8-179387 | 7/1996 |
| JP | 10-170877 | 6/1998 |
| JP | 10-270749 | 10/1998 |
| JP | 2000-89270 | 3/2000 |
| JP | 2000-150900 | 5/2000 |
| WO | WO 00/16411 | 3/2000 |
| WO | WO 00/59039 | 10/2000 |

OTHER PUBLICATIONS

Takashi Asano et al.; Department of Electronic Science and Engineering, C–I, vol. J82–C–I, No. 6, pp. 291–300, 1999. Discussed in the spec.

* cited by examiner

Primary Examiner—Ngân V. Ngô
(74) Attorney, Agent, or Firm—Westerman, Hattori, Daniels & Adrian, LLP

(57) ABSTRACT

Disclosed is an optical semiconductor device which has a quantum well structure comprising a quantum well made of a zinc oxide or a zinc oxide mixed crystal thin film, and utilizes optical transition between subbands in the quantum well structure. An element of this device can be formed as a film on a transparent substrate or a plastic substrate at a temperature of 200° C. or lower. The quatum well structure includes a barrier layer made of an insulating material such as ZnMgO; a homologous compound expressed by the following general formula: $RMO_3(AO)m$, wherein R=Sc or In, M=Fe, Cr, Ga or Al, A=Zn, Mg, Cu, Mn, Fe, Co, Ni or Cd, and m=a natural number; or $(Li, Na)(Ga, Al)O_2$. The optical semiconductor device is capable of using a transparent or plastic substrate as its substrate, and achieving a high-efficient wide-band light-emitting or receiving device and an ultrafast optical moderation or switching applicable to an optical communication system requiring one terabit/sec or more of data transmission speed.

8 Claims, 5 Drawing Sheets

Intersubband-Intersubband Optical Switch

Intersubband-Interband Optical Modulator

OPTICAL SEMICONDUCTOR ELEMENT UTILIZING OPTICAL TRANSITION BETWEEN ZNO HETEROSTRUCTURE SUB-BANDS

FIELD OF THE INVENTION

The present invention relates to an optical semiconductor device utilizing intersubband optical transitions to achieve a high-efficient wide-band light-emitting or receiving device and an optical switch or moderator for ultrafast optical controls.

BACKGROUND ART

An optical semiconductor device based on intersubband transitions in a quantum well structure is regarded as one of noteworthy devices operable in the range of a near-infrared band to a terahertz band, for the reason that it has high probability of inducing optical transitions between subbands and high potential of structurally controlling the transition wavelength in a wide rage.

For example, Japanese Patent Laid-Open Publication No. H08-179387; discloses an optical switch having a quantum well structure comprising of a GaN well layer and an AlN barrier layer which are formed on a single-crystal (compound superconductor or sapphire) substrate, wherein the band-edge energy $E_{EDGE}$ of the GaN well layer is two times or more greater than the energy $E_{OP}$ corresponding to the subband energy spacing in the GaN well layer at the operating wavelength of the optical switch.

Japanese Patent No. 2991707 discloses a coupled quantum well structure formed on a single-crystal substrate such as indium-phosphorus (InP). The coupled quantum well structure comprises a pair of first quantum well layers having the same width, a second quantum well layer having a width different from that of the first quantum well layer, and a quantum barrier layer having a width less than those of the first and second quantum well layers, wherein the second quantum well layer is disposed between the first quantum well layers, and the quantum barrier layer is disposed between the first and second quantum well layers. Each of the first and second layers is made of InGaAs, and the quantum barrier layer is made of AlAs, AlGaAs, AlAsSb or AlGaAsSb. The energy spacing between all of subbands in a conduction bend of the coupled quantum well structure is 36 meV or more.

The "Transaction of the Institute of Electronics, Information and Communication Engineering, Japan" (Suguru Asano, Susumu Noda "Ultrafast Optically Controlled Modulation Using Intersubband Transition", '99/6, Vol. J82-C-1, No. 6, pp 291–300) also discloses a device using midinfrared intersubband transitions in a GaAs/AlGaAs quantum well formed on a GaAs substrate, and its potential for achieving an ultrafast optically controlled modulation of a half bandwidth of about 1 ps with a low energy of about 1 pJ/pulse.

This article also reports that, in the GaAs/AlGaAs quantum well on the GaAs substrate, In can be added into its quantum well layer to provide a narrowed forbidden bandwidth therein, and the Al composition of its barrier layer can be increased to provide a widened forbidden bandwidth therein, so as to form an InGaAs/AlAs quantum well structure having a well depth of 1.1 eV or more, which is significantly enlarged, as compared to about 0.3 eV in a conventional GaAs/Al$_{0.3}$Ga$_{0.7}$As, to achieve the shorter intersubband transition wavelength, specifically a near-infrared wavelength of 1.9 $\mu$m.

DISCLOSURE OF THE INVENTION

The conventional optical semiconductor device based on intersubband transitions has a restriction in application to a particular device, such as a display, because its element has been primarily formed on an opaque substrate such as GaAs or InP. In addition, the intersubband transitions at a shorter wavelength must be achieved by reducing the width of the well layer to the level of several atomic layers and producing a deep quantum well in energetic aspects. Particularly, an extremely deep well (1.5 eV or more) is essential to achieve the intersubband transition at a wavelength range of 1.55 $\mu$m or more, required for optical communications.

In view of the above circumstances, it is an object of the present invention to provide an optical semiconductor device utilizing intersubband optical transitions in quantum wells, capable of using a transparent substrate as its substrate and achieving a high-efficient wide-band light-emitting or receiving device and an ultrafast optical modulation or switching applicable to an optical communication system requiring one tera-bit/sec or more of data transmission speed.

In order to achieve the above object, the present invention is directed to use a ZnO heterostructure formed on a transparent substrate so as to achieve (a) a high-efficient wide-band light emitting or receiving device utilizing optical transitions between subbands in the ZnO heterostructure and (b) an ultrafast optically controllable optical modulator or switch utilizing optical transitions between subbands in the ZnO heterostructure.

Specifically, the present invention provides an optical semiconductor device which including a transparent substrate and an optical semiconductor element formed on the substrate, wherein the element and the substrate are transparent in their entirety in a visible light range. The element having a quantum well structure comprising: a quantum well made of a zinc oxide or a zinc oxide mixed crystal thin film, the quantum well having a width of 2.5 nm or less: and a barrier layer made of an insulating material selected from the group consisting of SiOx: SiNx; ZnMgO; a homologous compound expressed by the following general formula: RMO$_3$(AO)m, wherein R=Sc, Fe or In, M=In, Fe, Cr, Ga or Al, A=Zn, Mg, Cu, Mn, Fe, Co, Ni or Cd, and m=a natural number: and (Li, Na)(Ga, Al)O$_2$. In the optical semiconductor device, the element is formed as a ZnO superlattice structure, and the optical semiconductor device is adapted to utilize intersubband optical transitions of subbands belonging to the same band in the quantum well structure so as to emit and receive light through the ZnO superlattice structure, or to receive light through an effect of intersubband light absorption, or to switch light optically controllably through an effect of intersubband absorption saturation.

Further, the present invention provides a semiconductor light-emitting or receiving device comprising the above optical semiconductor device, wherein the quantum well structure and the ZnO superlattice structure are formed as one or multilayered heterostructure. This The light-emitting or receiving device is adapted to utilize intersubband optical transitions of subbands belonging to the same band in the quantum well structure to be caused by a carrier introduced from a miniband in the ZnO superlattice structure into the subbands in the adjacent quantum well made of the zinc oxide or the zinc oxide mixed crystal thin film.

The present invention further provides a semiconductor optical switch or modulator comprising the above optical semiconductor device. In the optical switch or modulator, a control light is arranged to be a light corresponding to one of intersubband transition energies in a conduction band of the quantum well structure, and a signal light is arranged to be a light corresponding to the same intersubband transition energy as that of the control light, or a light corresponding to another intersubband transition energy in the conduction band of the quantum well structure.

The present invention further provides a semiconductor optical switch or modulator comprising the above optical semiconductor device. In the optical switch or modulator, a control light is arranged to be a light corresponding to one of intersubband transition energies in a valence band of the quantum well structure, and a signal light is arranged to be a light corresponding to the same intersubband transition energy as that of the control light, or a light corresponding to another intersubband transition energy in the valence band of the quantum well structure.

The present invention further provides a semiconductor optical switch or modulator comprising the above optical semiconductor device. In the optical switch or modulator, a control light is arranged to be a light corresponding to one of intersubband transition energies in a conduction band of the quantum well structure, and a signal light is arranged to be a light in a band resonant with a subband in the conduction band and a band in a valence band of the quantum well structure.

The present invention further provides a semiconductor optical switch or modulator comprising the above optical semiconductor device. In the optical switch or modulator, a control light is arranged to be a light corresponding to one of intersubband transition energies in a valence band of the quantum well structure, and a signal light is arranged to be a light in a band resonant with a subband in the valence band and a band in a conduction band of the quantum well structure.

Compound semiconductors such as III group-nitrides, II group-selenides and II group oxides have been known as a material of conventional light-emitting devices for use in a blue or infrared range. ZnO, one of II group oxides, is a transparent conductive material. More specifically, ZnO is a II–VI group semiconductor having a band gap of 3.37 eV at room temperature. While ZnO is analogous to GaN belonging commonly to wurtzite in terms of band gap and lattice constant, it has a significantly high exciton binding energy of 60 meV. In the present invention, the well layer of the optical semiconductor device based on intersubband transitions in the ZnO heterostructure can have a reduced width of several atomic layers.

The barrier layer is made of the insulating material, such as $SiO_x$; $SiN_x$; homologous compounds thereof or $(Li, Na)(Ga, Al)O_2$, which exhibits excellent lattice matching with ZnO and has extremely large band offsets. FIG. 1 shows the relationship between the respective lattice constants of ZnO and its homologous compounds. The horizontal axis represents an ionic radius in the A-site with CN: 6 in the oxide, and the vertical axis represents a cell parameter (nm). FIG. 2 shows the relationship between the width of ZnO quantum well and intersubband transition energy (calculated values). The horizontal axis represents the width of ZnO quantum well (nm), and the vertical axis represents an intersubband transition energy (eV).

As shown in FIG. 1, ZnO has an excellent lattice matching with the homologous compounds, typical of the insulating material, expressed by the following general formula: $RMO_3(AO)m$ (wherein R=Sc, Fe or In; M=In, Fe, Cr, Ga or Al; A=Zn, Mg, Cu, Mn, Fe, Co, Ni or Cd; and m=a natural number). The heterostructure including the barrier layer made of such an insulating material has an extremely large discontinuous band or a wide effective wavelength range of a near-infrared band to a terahertz band.

Further, as shown in FIG. 2, a large band discontinuity of the level of several eV exists between ZnO as the well layer and the insulating material represented by the homologous compounds: $RMO_3(AO)m$ (wherein R=Sc, Fe or In; M=In, Fe, Cr, Ga or Al; A=Zn, Mg, Cu, Mn, Fe, Co, Ni or Cd; and m=a natural number), which provides significantly enhanced wavelength variability.

Furthermore, ZnO can be deposited as a film on a thermolabile transparent substrate, such as ITO, or a plastic substrate, such as a plastic film, at a low temperature of 200° C. or less. The ZnO-heterostructure intersubband-transition-based optical semiconductor device of the present invention can be incorporated in a ZnO-based transistor or laser. While the substrate may be a compound semiconductor substrate or a sapphire substrate as in the conventional devices, the transparent substrate such as ITO can open the way for new device applications such as displays.

FIG. 3 shows the relationship between intersubband transition energy and intersubband relaxation time (calculation values). The horizontal axis represents a transition energy, and the vertical axis represents intersubband relaxation time (pico second). An ultrafast switching of a signal light in an optically controllable switch is required to provide an ultrafast relaxation of excited carriers. ZnO has a relaxation time approximately two-time shorter than that of GaN, and can repeat the tera-bit level of operations. In an optical modulator, a modulated frequency is determined by the intersubband relaxation time. The ZnO-heterostructure intersubband-transition-based optical semiconductor device of the present invention can modulate a light in an ultraviolet (blue, violet) region at a high speed with a light in the range of a terahertz band to an near-infrared band.

BEST MODE FOR CARRYING OUT THE INVENTION

Figure 4:
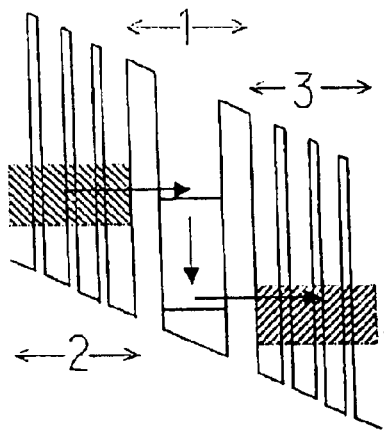
FIG. 4 is a schematic diagram showing a light-emitting device of the present invention, which has one or multilayered sets of a ZnO quantum well structures and ZnO superlattice structures disposed on both sides thereof, respectively.
Figure 5:
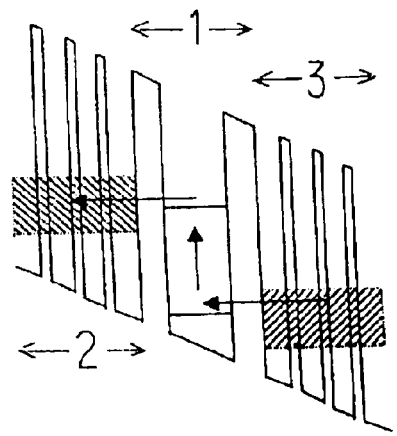
FIG. 5 is a schematic diagram showing a light-receiving device of the present invention, which has one or multilayered sets of a ZnO quantum well structures and ZnO superlattice structures disposed on both sides thereof, respectively.
Figure 6:
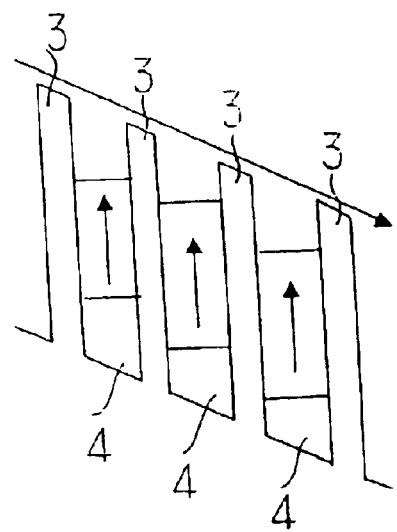
FIG. 6 is a schematic diagram showing a light-receiving device of the present invention, which has one or multilayered ZnO quantum well structures including a doped well layer or a doped barrier layer.

[A] Structure of Light-Emitting/Receiving Devices based on Intersubband Transitions in ZnO Heterostructure FIG. 4 is a schematic diagram showing a light-emitting device of the present invention, which has one or multilayered sets of a ZnO quantum well structures and ZnO superlattice structures disposed on both sides thereof, respectively. FIG. 5 is a schematic diagram showing a light-receiving device of the present invention, which has one or multilayered sets of a ZnO quantum well structure and ZnO superlattice structures, respectively, disposed on both sides thereof.

As shown in FIGS. 4 and 5, each of the light-emitting and light-receiving devices comprises one or multilayered sets of a ZnO quantum well structure 1 and ZnO superlattice structures 2, 3. Each of the ZnO quantum well structure and the ZnO superlattice structure is composed of one or more ZnO or ZnO mixed crystal layers and one or more homologous compound or (Li, Na)(Ga, Al)O$_2$ layers, which are laminated alternately. The light-receiving device may have one or multilayered ZnO quantum well structures 4 including a doped well layer or a doped barrier layer.

Figure 7:
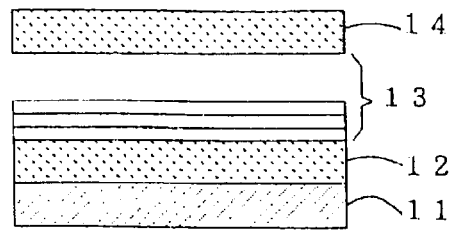
FIG. 7 is a sectional view showing an optical semiconductor device operable as a light-emitting or receiving device, according to one embodiment of the present invention.

FIG. 7 is a sectional view showing an optical semiconductor device according to one embodiment of the present invention. A quantum well structure 13 formed by alternately laminating one or more ZnO or ZnO mixed crystal layers each serving as a well layer, and one or more homologous compound or (Li, Na)(Ga, Al)O$_2$ layers each serving as a barrier layer is formed on a substrate 11 through a clad layer 12 made of ZnO mixed crystal or homologous compound. Another clad layer 14 made of ZnO mixed crystal or homologous compound is formed on the quantum well structure.

Each of the well layer and the barrier layer is arranged to have a thickness in the range of several nm to several ten run. These layers may be formed through an organic metal chemical vapor deposition (MOCVD) method or a laser-induced molecular beam epitaxy (MBE). Preferably, the barrier layer in the superlattice and quantum well structures is made of an insulating material such as ZnMgO; its homologous compound expressed by the following general formula: RMO$_3$(AO)m (wherein R=Sc, Fe or In, M=In, Fe, Cr, Ga or Al, A=Zn, Mg, Cu, Mn, Fe, Co, Ni or Cd, and m=a natural number); or (Li, Na)(Ga, Al)O$_2$.

(Li, Na)(Ga, Al)O$_2$, e.g. LiGaO$_2$, has a wurtzite-type crystal structure, and its lattice mismatching with ZnO is 3%. The LiGaO$_2$ layer can be formed as a thin film on ZnO at a growing temperature of 450 to 750° C. under an oxygen partial pressure of about $1\times10^{-4}$ Torr through a PLD method using a LiGaO$_2$ single-crystal target.

The light-emission based on intersubband transitions in the ZnO heterostructure is induced when a carrier introduced from a miniband in the ZnO superlattice structure into the second subband in the adjacent ZnO quantum well is relaxed toward subbands belonging to the same band in the ZnO quantum well. The light-receiving based on intersubband transitions in the ZnO heterostructure is induced when a carrier introduced from a miniband in the ZnO superlattice structure into the first subband in the adjacent ZnO quantum well structure absorbs light so that it is excited toward subbands belonging to the same band in the Zn quantum well.

The light-receiving based on intersubband transitions in the ZnO heterostructure can also be induced through an effect of intersubband light absorption in the ZnO quantum well structure including a doped well layer or a doped barrier layer. In either case, the light-receiving operation is measured by detecting a current induced by the intersubband light absorption.

Figure 1:
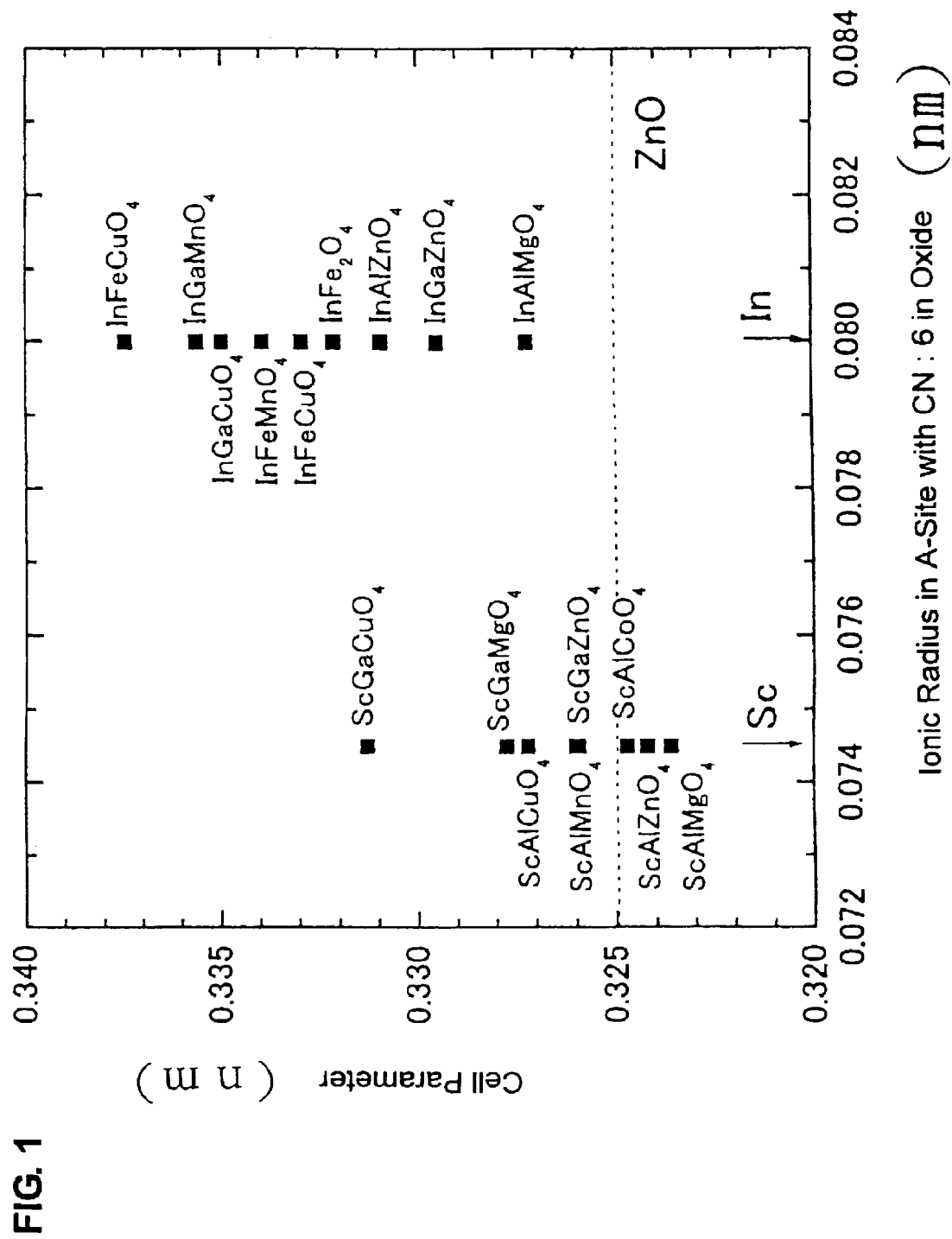
FIG. 1 shows the relationship between the respective lattice constants of ZnO and its homologous compounds.
Figure 2:
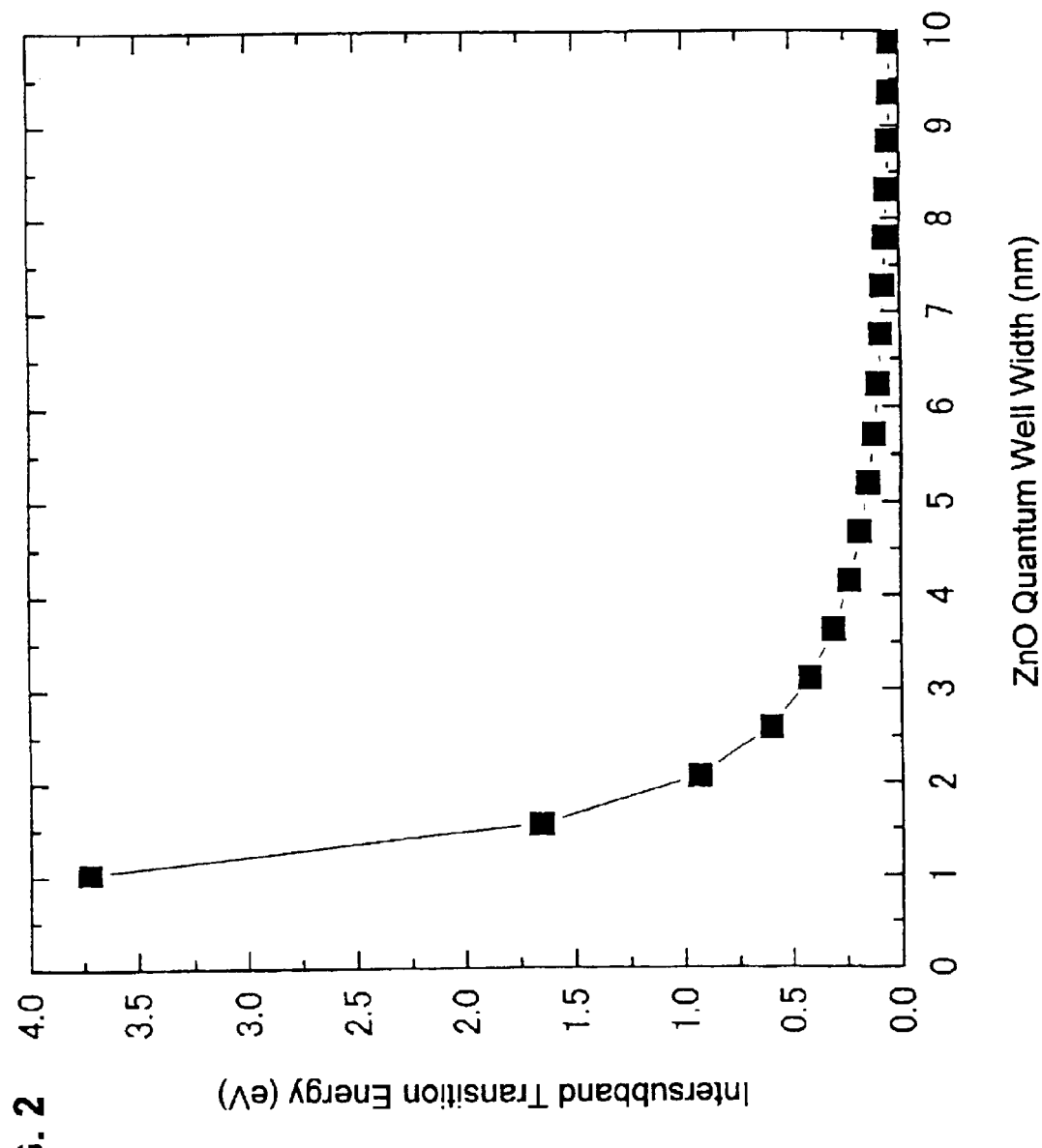
FIG. 2 shows the relationship between the width of ZnO quantum well and intersubband transition energy (calculated values) on the assumption that a barrier potential is infinite.

An excellent lattice matching between ZnO and its homologous compound or (Li, Na)(Ga, Al)O$_2$, as shown in FIG. 1, allows the optical semiconductor device to emit and receive light in a wide range of an infrared band to a terahertz band, as shown in FIG. 2.

The light-emitting/receiving operation is achieved by introducing a carrier into a specific subband or removing the carrier from the subband. The superlattice structure serves as a bridge for introduced a carrier into a specific subband and removing the carrier therefrom. As shown in FIG. 4, a band including a plurality of subbands each having approximately the same energy as that of a so-called miniband to be formed in the superlattice structure can be used to facilitate the introduction and removal of the carrier. If a carrier is injected from an electrode layer directly to a specific subband, an extremely high electric field will be imposed on the quantum well structure, resulting in breakdown of the device.

Figure 8:
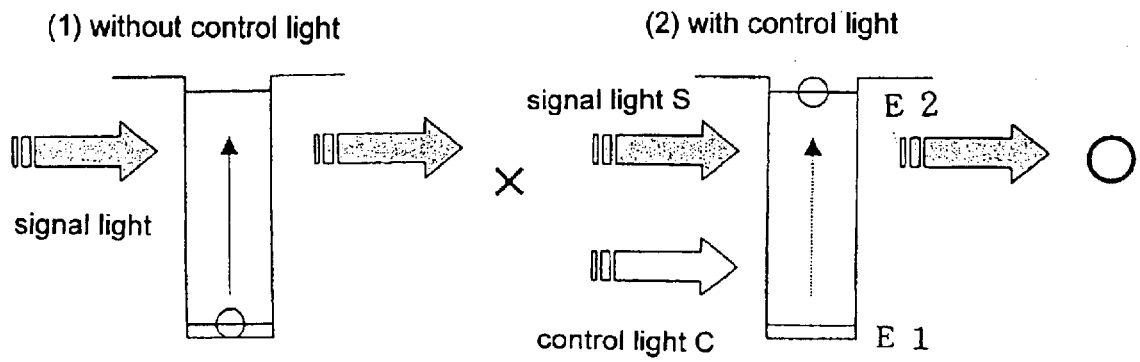
FIG. 8 is a schematic explanatory diagram of an operational principle of an optical switch of the present invention, which has one or multilayered ZnO quantum well structures.

[B] Structure of Optically Controllable Optical Switch and Modulator based on Intersubband Transitions in ZnO Heterostructure FIG. 8 schematically shows an operational principle of an intersubband-transition-based optical switch of the present invention. When a first light (referred to as "control light C") resonant with the intersubband energy of subbands belonging to the same band is incident in an quantum well structure, all carriers are shifted from the ground level (E1) to the excitation level (E2) through an effect of intersubband light absorption, and the effect of intersubband light absorption will finally vanish away. Thus, a second incident light (referred to as "signal light S") resonant with the same intersubband energy as or a different intersubband energy from the above intersubband energy can transmit through the quantum well structure because no carrier exists in the ground level (E1) due to the control light C.

Figure 9:
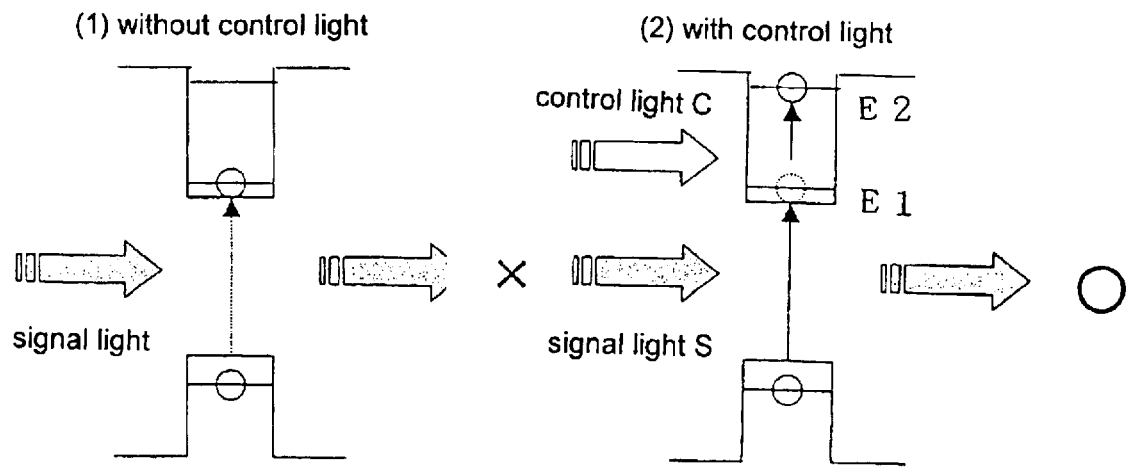
FIG. 9 is a schematic explanatory diagram of an operational principle of an optical modulator of the present invention, which has one or multilayered ZnO quantum well structures.

FIG. 9 schematically shows an operational principle of an intersubband-transition-based optical modulator. When a first light (referred to as "control light C") resonant with the intersubband energy of subbands belonging to the same band is incident in an quantum well structure, all carriers are shifted from the ground level (E1) to the excitation level (E2) through an effect of intersubband light absorption. Then, when a second incident light (referred to as "signal light S") resonant with an interband energy, a resultingly induced effect of interband light absorption allows the transmittance of the signal light S to be zero.

Figure 3:
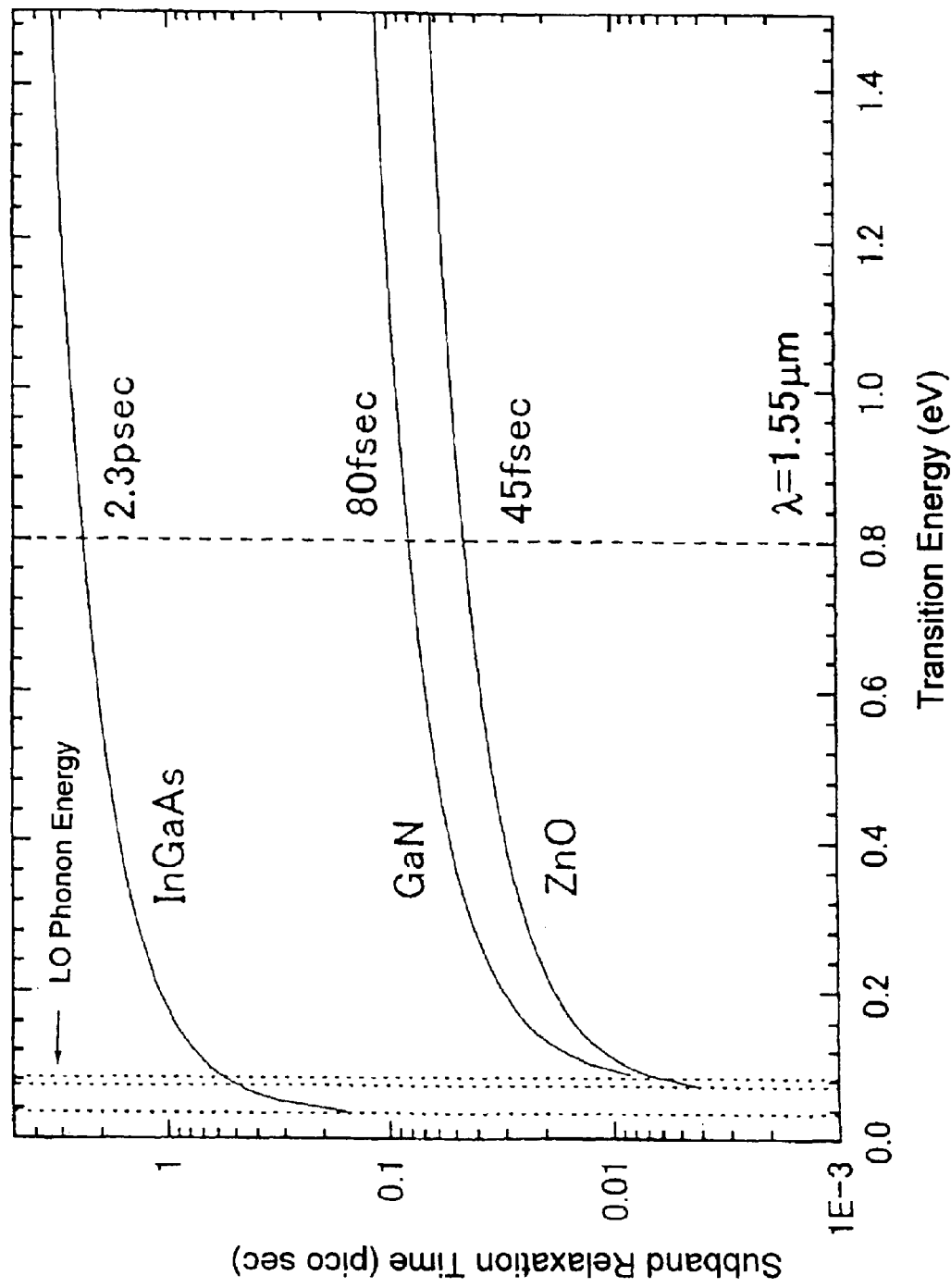
FIG. 3 shows the relationship between intersubband energy and intersubband relaxation time (calculation values).

An optically controllable optical switch based on intersubband transitions in the ZnO heterostructure is adapted to utilize an effect of intersubband absorption saturation. It is, however, difficult to achieve a high-speed operation by using the conventional material, such as GaAs, having a long intersubband relaxation time. As compared to GaAs and GaN, ZnO exhibits an extremely short intersubband relaxation time based on the Frohelich interaction, as shown in FIG. 3, and the band discontinuity between ZnO and the insulating material represented by the homologous compound: RMO$_3$(AO)m (wherein R=Sc, Fe or In, M=In, Fe, Cr, Ga or Al, A=Zn, Mg, Cu, Mn, Fe, Co, Ni or Cd, and m=a natural number) or (Li, Na)(Ga, Al)O$_2$. Thus, the ZnO heterostructure can achieve an ultrafast operation in 1.3 μm band and 1.55 μm band critical in optical communications.

In the ZnO heterostructure having the above ultrafast intersubband relaxation, an intersubband-resonant light can be used as a gate or control light to achieve an ultrafast moderation of an interband-resonant light in an ultraviolet region.

INDUSTRIAL APPLICABILITY

The present invention can provide a wide-band ultrafast optical semiconductor device based on intersubband transitions in a ZnO hetero structure, capable of forming its element on a transparent or plastic substrate to provide wide device applications. The optical semiconductor device of the present invention can be applied to various products such as a light-emitting diode, laser diode, photodector, optical switch and optical modulator which are operable in the range of a near-infrared region terahertz region.

What is claimed is:

1. An optical semiconductor device including a transparent substrate and an optical semiconductor element formed on said substrate, wherein said element and said substrate are transparent in their entirety in a visible light range, said element having a quantum well structure comprising:
   a quantum well made of a zinc oxide or a zinc oxide mixed crystal thin film,
   a barrier layer made of an insulating material selected from the group consisting of $SiO_x$; $SiN_x$; ZnMgO; a homologous compound expressed by the following general formula: $RMO_3(AO)m$, wherein R=Sc, Fe or In, M=In, Fe, Cr, Ga or Al, A=Zn, Mg, Cu, Mn, Fe, Co, Ni or Cd, and m=a natural number; and (Li, Na)(Ga, Al)$O_2$, wherein
   said element includes a ZnO superlattice structure, and
   said optical semiconductor device is adapted to intersubband optical transitions of subbands belonging to the same band in said quantum well structure so as to emit and receive light through said ZnO superlattice structure, or to receive light through an effect of intersubband light absorption, or to switch light optically controllably through an effect of intersubband absorption saturation.

2. The optical semiconductor device as defined in claim 1, wherein said element is formed on a plastic substrate.

3. The optical semiconductor device as defined in claim 1, wherein said element is formed as a film on a thermolabile substrate at a temperature 200° C. or less.

4. A semiconductor light-emitting or receiving device comprising the optical semiconductor device as defined in claim 1, wherein said quantum well structure and said ZnO superlattice structure are formed as one or multilayered heterostructure, wherein said light-emitting or receiving device is adapted to utilize intersubband optical transitions of subbands belonging to the same band in said quantum well structure to be caused by a carrier introduced from a miniband in said ZnO superlattice structure into said subbands in the adjacent quantum well made of the zinc oxide or the zinc oxide mixed crystal thin film.

5. A semiconductor optical switch or modulator comprising the optical semiconductor device as defined in claim 1, wherein a control light is arranged to be a light corresponding to one of intersubband transition energies in a conduction band of said quantum well structure, and a signal light is arranged to be a light corresponding to the same intersubband transition energy as that of said control light, or a light corresponding to another intersubband transition energy in the conduction band of said quantum well structure.

6. A semiconductor optical switch or modulator comprising the optical semiconductor device as defined in claim 1, wherein a control light is arranged to be a light corresponding to one of intersubband transition energies in a valence band of said quantum well structure, and a signal light is arranged to be a light corresponding to the same intersubband transition energy as that of said control light, or a light corresponding to another intersubband transition energy in the valence band of said quantum well structure.

7. A semiconductor optical switch or modulator comprising the optical semiconductor device as defined in claim 1, wherein a control light is arranged to be a light corresponding to one of intersubband transition energies in a conduction band of said quantum well structure, and a signal light is arranged to be a light in a band resonant with a subband in said conduction band and a band in a valence band of said quantum well structure.

8. A semiconductor optical switch or modulator comprising the optical semiconductor device as defined in claim 1, wherein a control light is arranged to be a light corresponding to one of intersuband transition energies in a valence band of said quantum well structure, an d a signal light is arranged to be a light in a band resonant with a subband in said valence band of said quantum well structure.

* * * * *